United States Patent
Laub et al.

(10) Patent No.: US 7,292,039 B1
(45) Date of Patent: Nov. 6, 2007

(54) CONTRAST ENHANCEMENT IN MAGNETIC RESONANCE IMAGING

(75) Inventors: Gerhard Laub, Los Angeles, CA (US); Vibhas Deshpande, Los Angeles, CA (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 0 days.

(21) Appl. No.: 11/507,365

(22) Filed: Aug. 21, 2006

(51) Int. Cl.
*G01V 3/00* (2006.01)

(52) U.S. Cl. ...................... 324/318; 324/309

(58) Field of Classification Search ........ 324/300–322; 600/410–445
See application file for complete search history.

(56) References Cited

U.S. PATENT DOCUMENTS

| | | | |
|---|---|---|---|
| 5,256,967 A * | 10/1993 | Foo et al. ................... 324/311 |
| 6,404,195 B1 * | 6/2002 | Deimling ................... 324/308 |
| 6,714,807 B2 * | 3/2004 | Zur ............................. 600/410 |
| 6,885,193 B2 * | 4/2005 | Foxall ........................ 324/309 |
| 7,205,763 B2 * | 4/2007 | Porter ........................ 324/306 |

\* cited by examiner

*Primary Examiner*—Brij B. Shrivastav
(74) *Attorney, Agent, or Firm*—Fish & Richardson P.C.

(57) ABSTRACT

Systems and techniques for acquiring a medical image of a region of interest are described. A plurality of electromagnetic excitation pulses are applied to the region of interest according to predetermined parameters, and a predetermined delay period is introduced after which the longitudinal magnetization of a first species generated within the region of interest reaches zero and a longitudinal magnetization of a second species generated within the region of interest is in steady-state.

20 Claims, 11 Drawing Sheets

CONTRAST ENHANCEMENT IN MAGNETIC RESONANCE IMAGING

TECHNICAL FIELD

This patent application relates to magnetic resonance imaging, and more particularly to contrast enhancement.

BACKGROUND

Magnetic resonance imaging (MRI) may incorporate a variety of contrast enhancement techniques to improve image contrast and to prevent unwanted tissues (e.g., fat) from being captured in the image. An example of one such conventional contrast enhancement technique is inversion recovery. Inversion recovery is used for the measurement of "$T_1$ constants," as well as for the suppression of resonance signals from unwanted tissues. A $T_1$ constant, sometimes referred to as a longitudinal relaxation constant, determines the rate at which approximately 63 percent of excited nuclei (also referred to as "species") realign with an applied uniform magnetic field. The process by which species realign with the applied uniform magnetic field is referred to as "relaxation." Species of different tissues and materials have different $T_1$ constants. Inversion recovery measures the time it takes for a particular unwanted $T_1$ species to reach zero magnetization after being inverted with a 180 degree radio-frequency (RF) pulse. At this time, resonance signals from the other species are measured and used to construct an image. Because the magnetization of the unwanted $T_1$ species at the time of data acquisition is zero, the material or tissue that generated the unwanted $T_1$ is absent from the image.

SUMMARY

The invention provides systems and methods, including computer program products, for acquiring a medical image of a region of interest.

In general, in one aspect, the invention features a system that includes a control sequence unit configured to direct an RF (radiofrequency) coil to apply a plurality of electromagnetic excitation pulses to the region of interest according to predetermined parameters. The plurality of electromagnetic excitation pulses are sufficient to generate first and second species within the region of interest such that a longitudinal magnetization of the first species is inverted, with the first species having a longer longitudinal relaxation time constant ($T_1$ constant) than the second species. The control sequence unit is also configured to direct the RF coil to apply electromagnetic energy sufficient to de-phase transverse magnetizations of first and second species, with the transverse magnetizations being oriented in a transverse direction with respect to an applied magnetic field. The system also includes a controller in communication with the control sequence unit. The controller is configured to determine an expiration of a predetermined delay period after which the longitudinal magnetization of the first species reaches zero and a longitudinal magnetization of the second species is in steady-state.

In general, in another aspect, the invention features a method and a computer program product for acquiring a medical image of a region of interest. A plurality of electromagnetic excitation pulses are applied to the region of interest according to predetermined parameters. The plurality of electromagnetic excitation pulses are sufficient to generate first and second species, with the first species having a longitudinal relaxation time constant (T1 constant) that is longer than a T1 constant of the second species, within the region of interest such that a longitudinal magnetization of the first species is inverted relative to zero. Electromagnetic energy sufficient to de-phase transverse magnetizations (i.e., magnetizations being oriented in a transverse direction with respect to an applied magnetic field) of the first and second species is applied, the transverse. A predetermined delay period (e.g. approximately between 10 ms and 70 ms) is introduced after which the longitudinal magnetization of the first species reaches zero and a longitudinal magnetization of the second species is in steady-state.

Embodiments may include one or more of the following. Resonance signals may be measured from the region of interest after the predetermined delay period has expired; and resonance signals may be used to reconstruct an image that shows a tissue that generated the second species but that does not show a tissue (e.g., fat) that generated the first species. Applying electromagnetic energy may include implementing one or more of gradient de-phasing and RF spoiling; and/or de-phasing the first and second species following an individual application of each of the plurality of electromagnetic excitation pulses. The predetermined parameters may be determined using one or more of a computer simulation and a phantom experiment that uses a model of a structure to be imaged. Examples of the predetermined parameters include: a predefined number of electromagnetic excitation pulses, a repetition time between an application of successive electromagnetic excitation pulses, a flip angle of each of the plurality of electromagnetic excitation pulses, and the predetermined delay period. A flip angle of each of the plurality of electromagnetic excitation pulses may be selected to be a value within a range between 30 and 60 degrees.

The system may further include a data acquisition unit in communication with the controller that is configured to acquire resonance signals from the region of interest after the predetermined delay period has expired. The plurality of electromagnetic excitation pulses may be sufficient to suppress a third species within the region of interest such that the image of the region of interest does not show a tissue that generated the third species. For example, the third species may have a $T_1$ constant that is different than the $T_1$ constant of the first species and that is longer than a $T_1$ constant of the second species. The sequence control unit may beconfigured to direct the RF coil to apply a predetermined number of alternating sequences of excitation pulses and electromagnetic energy sufficient to de-phase transverse magnetizations of first and second species. The predetermined parameters may be one or more of the following: a predefined number of electromagnetic excitation pulses; a repetition time between an application of successive electromagnetic excitation pulses; a flip angle of each of the plurality of electromagnetic excitation pulses; and the predetermined delay period. The data acquisition unit may be further configured to acquire the resonance signals using a data acquisition process selected from the group consisting of: fast low-angle shot (FLASH) acquisition, gradient-echo acquisition, spin-echo acquisition, steady-state free precession (SSFP) acquisition, and echo planar acquisition.

Particular implementations may provide one or more of the following advantages. RF preparation can be used to suppress unwanted long $T_1$ species while maintaining a high signal from a desired short $T_1$ species. RF preparation enables the short $T_1$ species to be brought into steady-state before data acquisition and remain in steady-state during data acquisition to reduce blurring of a resulting image. RF preparation can suppress a range of $T_1$ species simultaneously to improve uniformity of background suppression for in-vivo imaging.

At higher field strengths (e.g., above 3T), inversion pulses are difficult to design and may lead to the presence of $B_1$ inhomogeneity artifacts in the images. RF preparation uses inversion pulses having lower flip angles than those used in conventional inversion recovery to reduce the presence of $B_1$ inhomogeneity artifacts. RF preparation may also be useful in many other contrast-enhanced imaging applications, e.g., contrast-enhanced coronary MRA, cardiac perfusion imaging and cardiac viability imaging.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 4A is a flowchart of a process for acquiring an image using the MRI system of FIG. 2.

DETAILED DESCRIPTION

When acquiring an image of a region (e.g., an organ or other structure) within a subject, it is often desirable to prevent particular types of tissues from being captured in the image, especially if those tissues obscure other tissues that are of interest. In general for contrast-enhanced imaging, excited nuclei of unwanted tissues or materials, such as fat or muscle, have longer $T_1$ constants than excited nuclei of tissues or fluids (e.g., blood) whose presence in the image is desired. The region of a subject that is imaged is referred to as the "region of interest."

In a conventional inversion recovery process, the magnetizations of long and short $T_1$ species within the region of interest are inverted after a 180 degree pulse is applied to the region of interest. After the application of the 180 degree pulse, each species realigns with the static magnetic field at different rates depending on their $T_1$ time constants (i.e., the short $T_1$ species realigns with the static magnetic field more quickly than the long $T_1$ species). As a species undergoes relaxation, its magnetization follows a trajectory that proceeds from a negative value (inversion) to a positive value and eventually reaches a steady-state.

Figure 1:
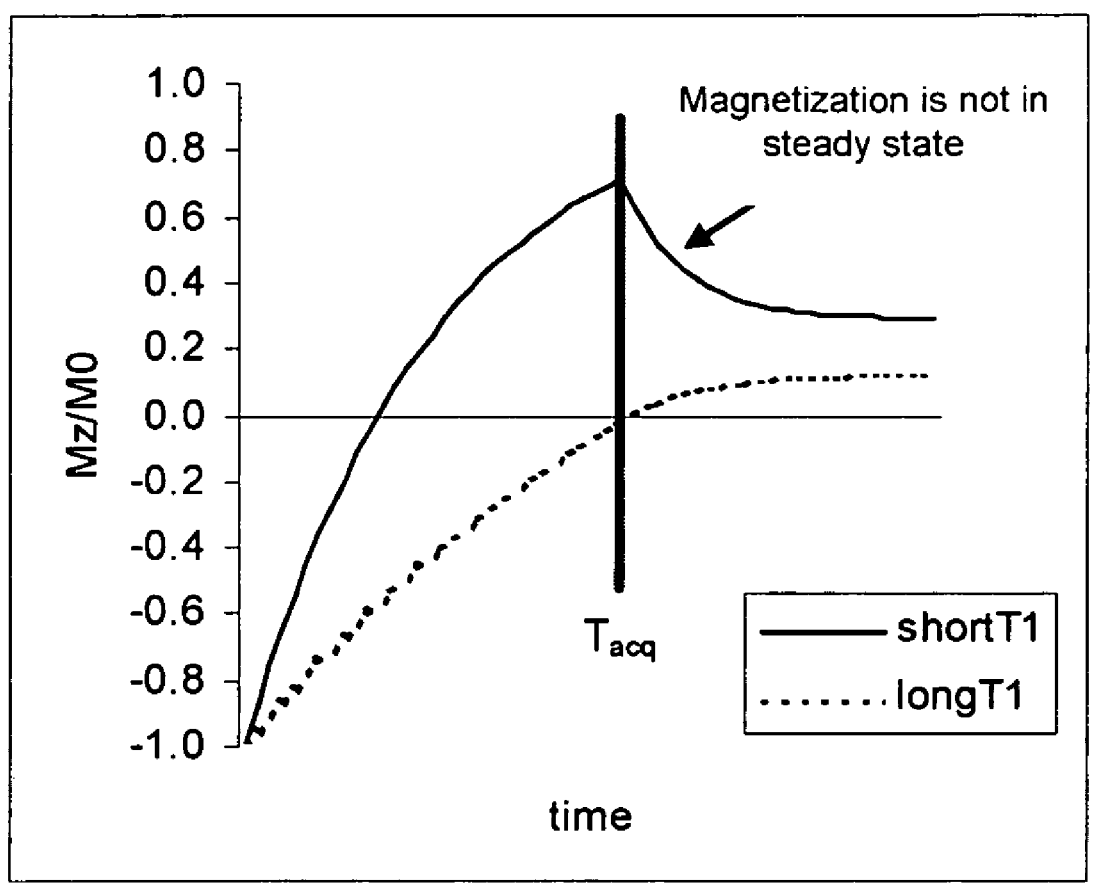
FIG. 1 shows a plot of the magnetizations of inversion-recovery-prepared $T_1$ species as a function of time.

Referring to FIG. 1, a plot 8 of the magnetizations of short $T_1$ species and long $T_1$ species undergoing relaxation during an inversion recovery process is shown. At a certain time, designated $T_{acq}$, the magnetization of the short $T_1$ species reaches a positive value and the long $T_1$ species reaches the zero-crossing. At this time $T_{acq}$, a resonance signal from the region of interest is acquired and later used to construct an image. Because the contribution of the long $T_1$ species to the resonance signal is zero, the tissue in which the long $T_1$ species were generated does not show up in the image. With inversion recovery, at the time $T_{acq}$ when the resonance signal from the short $T_1$ species is acquired, the magnetization of the short $T_1$ species is not in steady-state. Consequently, signal modulation occurs during data acquisition, particularly when the data is sampled, causing blurring in the resulting image.

The time required to complete an inversion recovery preparation (i.e., the duration of time between when the species are inverted and just before the resonance signal is acquired) is typically on the order of 100 ms and more. It is desirable to reduce the time required to acquire each image e.g. to increase the number of slices that can be acquired in each heartbeat in a perfusion scan. Since imaging is usually performed only during first pass of the contrast agent through the heart, there is only a small time window that is permissible for imaging. Increasing the coverage during this limited imaging time is crucial.

An RF preparation process for enhancing image contrast suppresses unwanted long $T_1$ species while enabling short $T_1$ species to be brought into steady-state before data acquisition to reduce blurring in resulting image. Compared to some conventional preparation processes, such as inversion recovery, RF preparation can be performed in less time to reduce the total imaging time required for one image.

Figure 2:
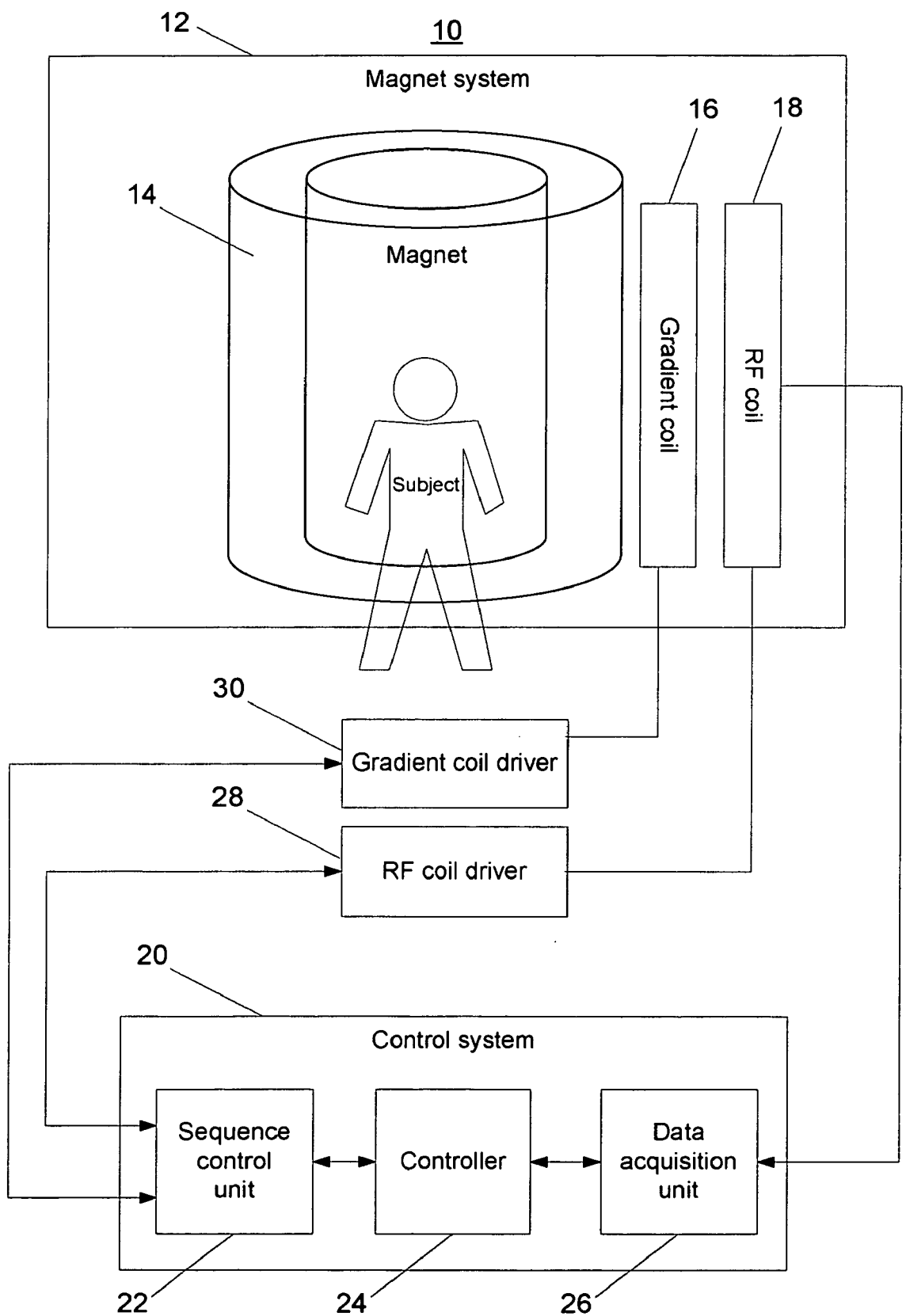
FIG. 2 is a block diagram of a magnetic resonance imaging (MRI) system.

Referring now to FIG. 2, a magnetic resonance imaging (MRI) system 10 configurable to perform the RF preparation process is shown. The MRI system 10 includes a magnet system 12, a control system 20, a gradient coil driver 30, and an RF coil driver 28. The magnet system 12 includes a magnet 14, a gradient coil 16, and an RF coil 18. The control system 20 includes a sequence control unit 22, a data acquisition unit 26, and a controller 24 that controls the operations of the sequence control unit 22 and the data acquisition unit 26. Control system 20 may be implemented via any type of processing device(s), such as on a single computing device or as multiple computing devices networked together (e.g., over a LAN).

The magnet 14 includes resistance or superconducting coils (not shown) that generate a steady, uniform magnetic field. The uniform magnetic field is generated in a scanning space or region in which the subject to be examined is disposed. For example, if the subject is a person or patient to be examined, the person or portion of the person to be examined is disposed in the scanning region.

The gradient coil 16 generates magnetic field gradients that are used to cause the strength of the static magnetic field produced by the magnet 14 to undergo gradients in the x, y, and z directions or combinations thereof. The gradient coil driver 30 is in communication with the gradient coil 16 and applies a driving signal to the gradient coil 16 for the purpose of generating magnetic field gradients.

The RF coil driver 28 is in communication with the RF coil 18 and transmits a driving signal to the RF coil 18. In response to receiving the driving signal, the RF coil 18 produces RF excitation signals (referred to as "RF pulses"), which are used for generating species (e.g., exciting nuclei) in the region of interest (e.g., an organ) of the subject being imaged within the space of the static magnetic field. The species generate a resonance signal that is detected by the RF coil 18. In some embodiments, a separate coil is used to detect the resonance signal. The data acquisition unit 26, which is in communication with the RF coil 18, acquires the resonance signal (sometimes referred to as an "echo") from the RF coil 18. The resonance signal is defined in a two-dimensional frequency domain or Fourier space, referred to as "k-space". The data acquisition unit 26 samples and digitizes the resonance signal and provides the resulting signal to the controller 24 as digital data for storage and/or further processing.

The controller 24 processes the digital data to obtain an image of the region of interest. The controller 24 may apply a variety of known image processing techniques to construct the image, which may be viewed on a display (not shown) coupled to the controller 24. The display may be provided, for example, as a monitor or a terminal, such as a CRT or flat panel display.

The sequence control unit 22 is connected to each of the gradient coil driver 30, the RF coil driver 28, and the controller 24. The controller 24 stores programs having instructions that cause the sequence control unit 16 to direct the delivery of RF pulses and gradient fields from the RF coil 18 and the gradient coil 16 to the region of interest. In response to receiving control signals provided from the sequence control unit 22, the gradient coil driver 30 provides a driving signal to the gradient coil 16, and the RF coil driver 28 provides a driving signal to the RF coil 18.

Figure 3:
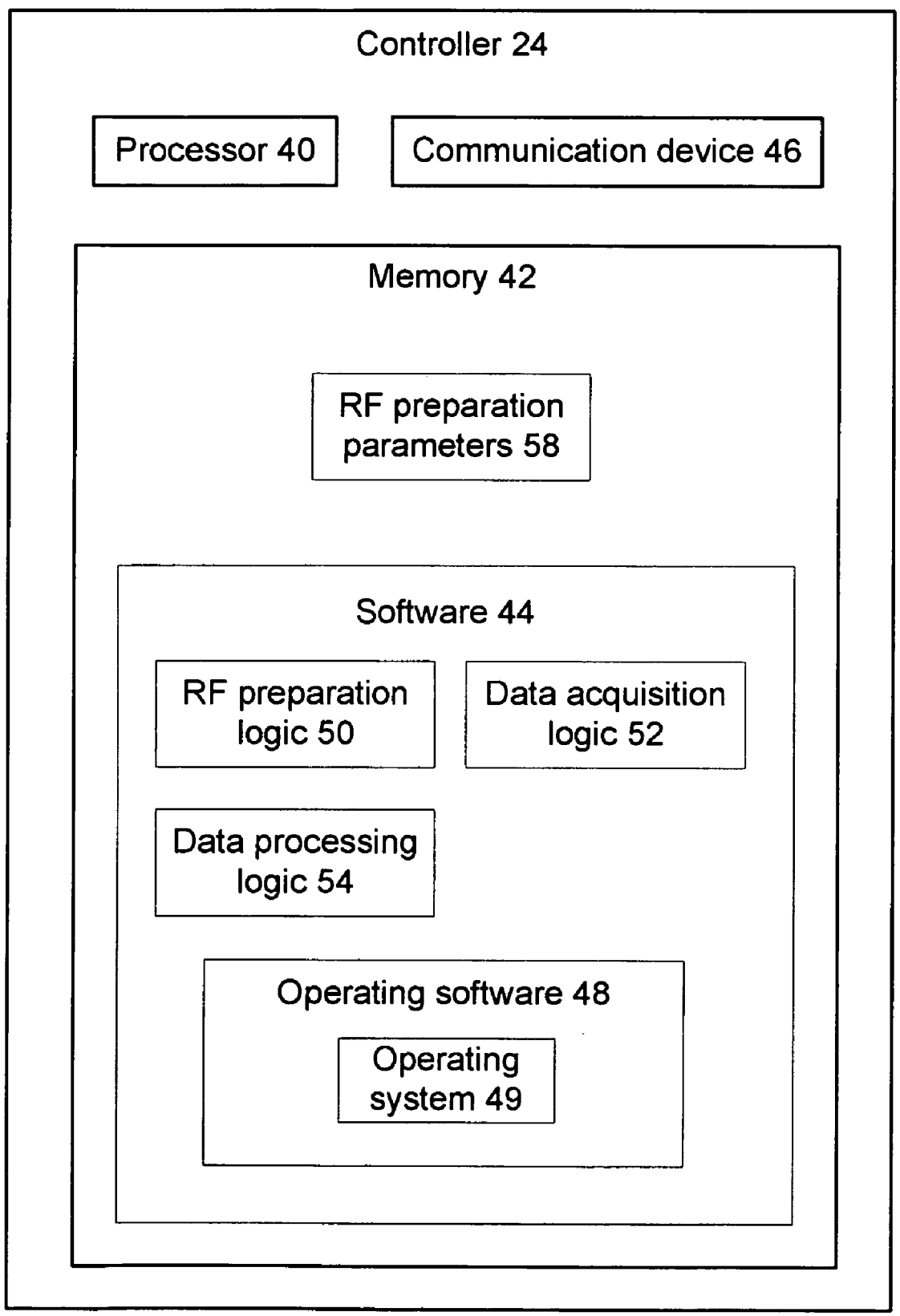
FIG. 3 is a block diagram of a controller for use with the system of FIG. 1.

Referring to FIG. 3, the controller 24 may be any type of computing device or may encompass multiple computing devices. The controller 24 includes one or more processor(s) 40 (referred to simply as "processor 40"), a communication device 46, and memory 42 that stores RF preparation parameters 58 and executes software 44. The communication device 46 converts information to a form that is suitable for transmission over communication channel (e.g., a network or a bus). In some implementations, communication device 46 is a port (e.g., a universal serial bus port). In other implementations, communication device 46 is an Ethernet card that converts information into packets for transmission over an Ethernet LAN. Other examples of communication device 46 include wireless access cards, and other network access hardware.

Software 44 includes, but are not limited to, RF preparation logic 50 for implementing RF preparation sequences, data acquisition logic 52 for operating the data acquisition unit 26, data processing logic 54 for constructing images from data provided by the data acquisition unit 26, and user interface logic 56 for interfacing with users. Controller 24 also includes an operating system software environment 48 that includes, but that is not necessarily limited to, an operating system 49, such as Windows XP®.

The RF preparation logic 50 performs functions necessary to implement RF preparation routines for generating species in the region of interest prior to acquiring MRI data. The RF preparation logic 50 accesses the RF parameters 58, which determine the properties of RF pulses and spoiler pulses applied in an RF preparation, stored in memory 42 and directs the application of RF pulses and gradient fields according to the RF parameters 58. These and other functions performed by the RF preparation logic 50 are further described below.

The data acquisition logic 52 controls the functions of the data acquisition unit 26. For example, the data acquisition logic 52 determines the time at which the data acquisition unit 26 acquires the resonance signal from the RF coil 18, the rate at which the data acquisition unit 26 samples the resonance signal, and the resolution at which the sampled data is digitized. The data acquisition logic 52 may also direct the data acquisition unit 26 to perform preliminary image processing on acquired data.

The data processing logic 54 applies image processing techniques on the acquired data to construct images of the region of interest. Such image processing techniques may include, for example, calculations of Fourier transforms, applications of image segmentation algorithms, filtering processes, and other appropriate MRI image processing techniques.

The user interface logic 56 provides an interface through which a user can configure the operations of the RF preparation logic 50, the data acquisition logic 52, and the data processing logic 54. The user interface logic 56 also enables a user to configure the operating parameters, including the RF preparation parameters 58, of the MRI system 10.

Figure 4B:
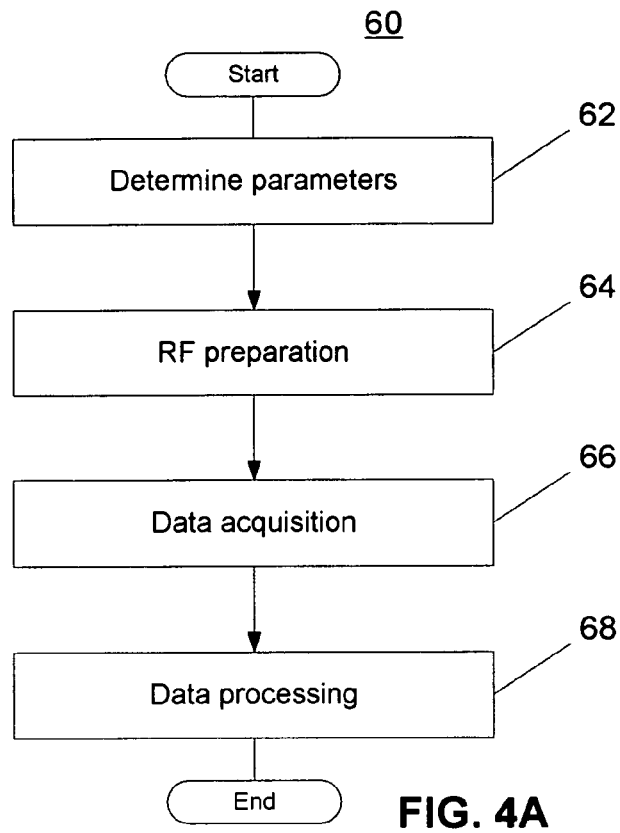
FIG. 4B is a diagram of an exemplary RF preparation process and data acquisition process.
Figure 4B:
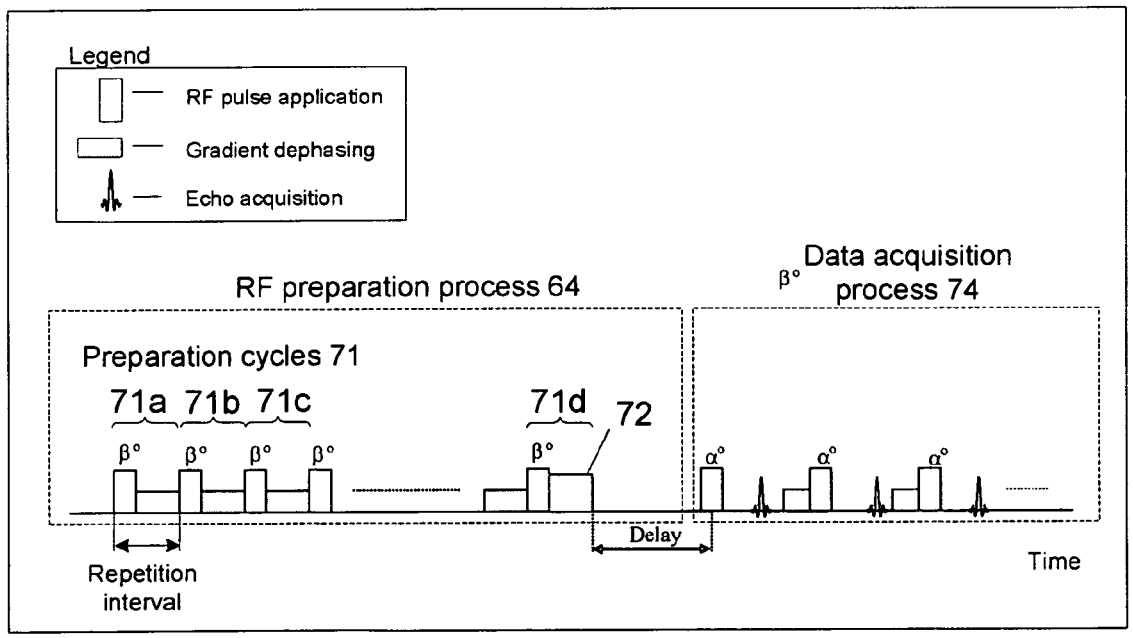

Referring to FIG. 4A, a process 60 for obtaining an image of a region of interest using the MRI system 10 of FIG. 1 includes a parameter determining process 62 for determining the RF preparation parameters 58, an RF preparation process 64, a data acquisition process 66 following the preparation process 64, and a data processing process 68 for constructing images from data acquired by the data acquisition process 66. The RF preparation process 64 is performed according to the RF preparation parameters 58 determined by the process 62 and is used primarily to improve the contrast of an MRI image by suppressing signal from unwanted tissues (e.g., fat). Data acquisition process 66 may be any data acquisition process or combination of data acquisition processes for use with MRI. Examples of data acquisition process 66 include, but are not limited to fast low-angle shot (FLASH), gradient-echo acquisition, spin-echo acquisition, steady-state free precession (SSFP), and echo planar acquisition. The data processing process 68 applies one or more data processing techniques for constructing images from the acquired data. For example, the data processing process 68 may apply a Fourier transform and a variety of filters to the acquired data. The RF preparation process 64 is described in further detail with respect to FIG. 4B Referring to FIG. 4B, a schematic diagram of the RF preparation process 64 and an exemplary data acquisition process 74 is shown. During the RF preparation process 64, the RF coil 18 directs a predetermined number of RF pulses having selected flip angles to the region of interest.

Following the application of an RF pulse, spoiler signals are applied to dephase the transverse magnetization of species in the region of interest so that these magnetizations are zero. The transverse magnetizations are oriented in a direction that is transverse to the direction of the applied uniform magnetic field. To de-phase transverse magnetizations, the spoiler signals may be applied to implement gradient de-phasing, RF spoiling, or both. During gradient de-phasing, a gradient is applied along different combinations of x-y- and z directions such that the excited species start de-phasing and their net transverse magnetization becomes zero. Only the longitudinal magnetizations of the species remain. At this point, resonance signals that are transverse to the applied magnetic field are zero. In RF spoiling, consecutive RF pulses with different phases are applied to the region of interest. The RF pulses may be incremented by the same value or by different values. For example, consecutive RF pulses may have 50-degree incremental phases (e.g., phases of zero, 50, 100, 150 and so on). Compared to gradient de-phasing, RF spoiling generally takes more time to de-phase excited nuclei. Furthermore gradient de-phasing is reversible (i.e., at a later stage transverse magnetization can be rephased). RF spoiling on the other hand is irreversible.

A single RF pulse followed by subsequent gradient de-phasing is referred to as a "preparation cycle." In FIG. 4B, preparation cycles 71a-d are each represented pictorially by a pair of adjacent white and shaded boxes. During the last preparation cycle 71d of the preparation process 64, a large gradient spoiler 72 is applied to prevent coherences of species within the region of interest from re-phasing during the data acquisition process 74. At this point, the longitudinal magnetization of the unwanted species is inverted. The gradient spoiler 72 is followed by a time delay to allow the inverted magnetization of the unwanted species to reach zero, after which data acquisition is performed.

The number of preparation cycles, the flip angle and pulse length of the RF pulses, the repetition time, and delay time before data acquisition are RF preparation parameters 58 that depend on the species to be suppressed as well as the physiology of the region of interest. For example, a number of preparation cycles that is sufficient to suppress signal contributions from water may be different than a number of preparation cycles that is sufficient for suppressing signals from fat. Combinations of RF preparation parameters 58 that are suitable for suppressing different types of species in various environments are determined in process 62 (FIG. 4A) using numerical simulations, phantom experiments, and human experiments. In general, the flip angles of the RF preparation pulses may range between 30 and 60 degrees, though in some embodiments, the flip angles may be less than or greater than this typical range.

In practice, the time delay of the RF preparation process 64 ranges between approximately 10 ms and 70 ms, though the time delay could be below or above this range depending on the parameters used in the preparation process 64 and the species chosen to be suppressed. In comparison, the delay time associated with inversion recovery is generally about 100 ms or more.

The time interval over which an RF preparation cycle takes place is referred to as the "repetition time." The repetition times of the preparation cycles are reduced to reduce the overall time of the preparation process 64. For example, the total time required to complete the RF preparation process 64 may be typically on the order of 10-50 ms. Examples of using numerical simulations, phantom experiments, and human experiments to determine suitable parameters for a given species are described in the Examples section below.

The data acquisition process 66 may employ any standard data acquisition process used for acquiring resonance signals. FIG. 4B shows an exemplary data acquisition process 66 that repeats the process of applying an RF pulse of a given flip angle α, acquiring an echo that represents one line of k-space (i.e., frequency space), and de-phasing transverse magnetization components of species using gradient de-phasing, RF spoiling, or both. The data acquisition process 66 repeats the process until a complete frequency space is acquired. For example, to acquire a complete frequency space of 200 lines of k-space (i.e., spatial frequency), the process is performed 200 times. In some embodiments involving cardiac imaging, the data acquisition process 66 repeatedly acquires 25 lines of k-space per heart beat until the entire frequency space has been acquired. The acquired data includes the relative magnitude and phase components of detected resonance signals as a function of k-space. To construct an image from the acquired data, data processing process 68 applies a Fourier transform and/or other mathematical algorithms to the data.

Figure 5:
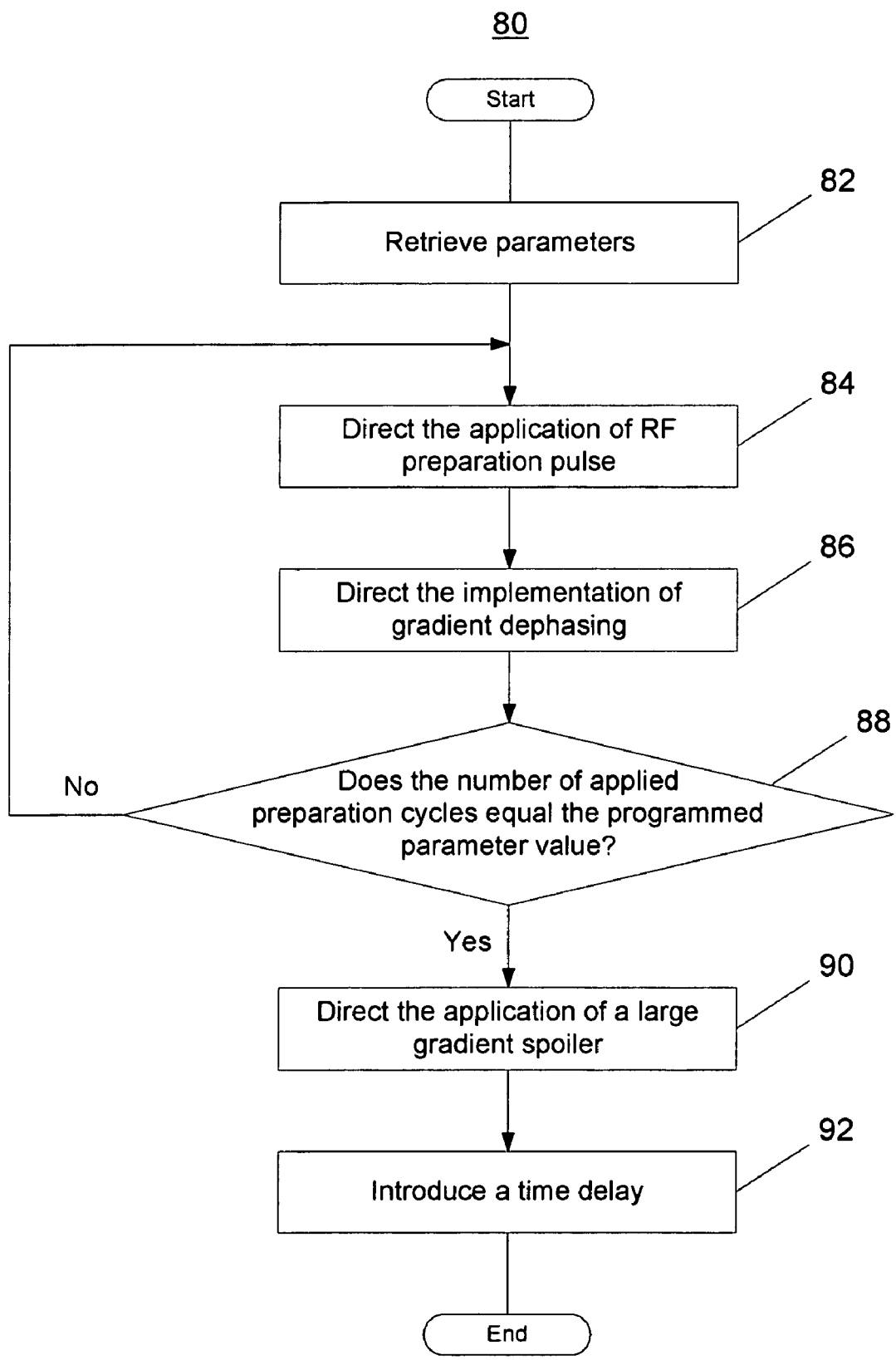
FIG. 5 is a flowchart of an RF preparation process.

Referring to FIG. 5, RF preparation logic 50 performs a control process 80 for controlling the execution of the preparation process 64. Initially, the control process 80 retrieves (82) from memory 42 (FIG. 3) the RF preparation parameters 58 to be used for suppressing a desired species in a known physiological environment and determined a priori in process 62 of FIG. 4A from experiments or computer simulations. The RF parameters include, for example, the number of preparation cycles to be applied, the flip angle and pulse length of the RF pulses, the repetition time, gradient de-phasing parameters, and a delay time to be introduced before data acquisition. The control process 80 directs the sequence control unit 22 to apply (84) an RF pulse having a flip angle prescribed by the flip angle parameter. The control process 80 then directs the control sequence unit 22 to implement (86) gradient de-phasing to de-phase transverse magnetizations of species. In some embodiments, the control process 80 may direct the control sequence unit 22 to implement RF spoiling rather than gradient de-phasing. The application of RF pulses followed by gradient de-phasing is repeated until the control process 80 determines (88) that the number of applied preparation cycles is equal to the number stored in the corresponding parameter. The control process 80 directs the control sequence unit 22 to apply (90) a large gradient spoiler, sufficient to dephase the spins by 360 deg. in a minimum voxel size desired, to the region of interest to prevent the coherences from re-phasing. After the application of the spoiler gradient, the longitudinal magnetization of the species to be suppressed is inverted. The control process 80 introduces (92) a time delay after which the longitudinal magnetization of the inverted species to be suppressed reaches zero while the longitudinal magnetizations of the other species remain in steady-state. At this time, the data acquisition process 66 of FIG. 4A begins acquiring data.

Figure 6:
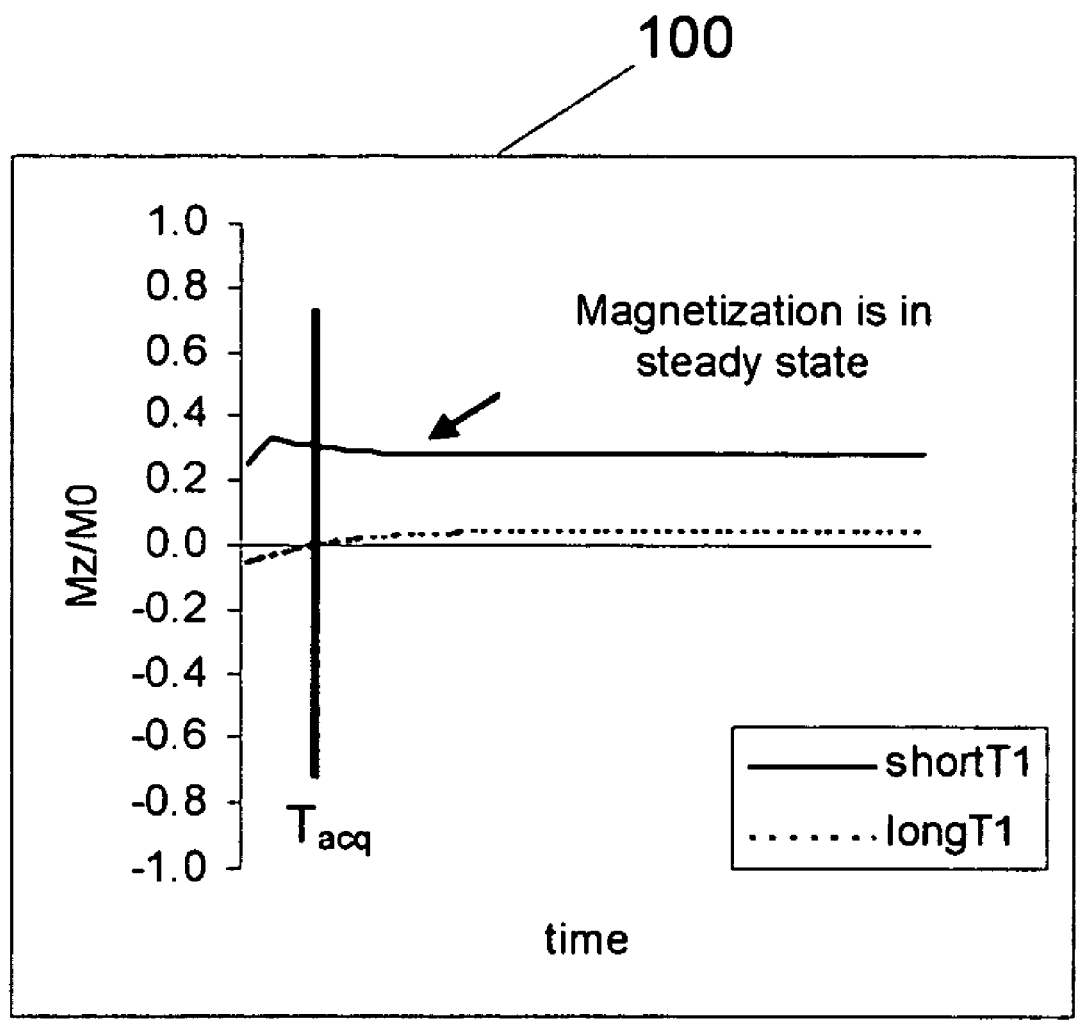
FIG. 6 shows a plot of the magnetizations of RF-prepared $T_1$ species as a function of time.

Referring to FIG. 6, a plot 100 of the longitudinal magnetizations of short $T_1$ species and long $T_1$ species as a function of time right after the application of the large gradient spoiler (step 90 of FIG. 5) is shown. As seen in the plot 100, the magnetization of the short $T_1$ species reaches steady-state before the magnetization of the long $T_1$ species reaches zero at a time $T_{acq}$ as it proceeds from an initial inverted state to a non-inverted state. The time $T_{acq}$ is equal to the time delay introduced in step 92 of FIG. 5 and is precisely the time at which the data acquisition process (step 92 of FIG. 4A) acquires image data by measuring resonance signals generated from the region of interest. The magnetization of the short $T_1$ species is in steady-state before and throughout data acquisition.

EXAMPLES

Numerical simulations, phantom studies, and a volunteer study were used to assess the performance of the RF preparation process 64.

Numerical Simulations

Numerical simulations were performed in Matlab® (available from Mathworks Inc., Natick, Mass., USA) to simulate the trajectories of the longitudinal and transverse magnetizations in samples with two different $T_1$ values: 57 ms ($\cong T_1$ of contrast-enhanced blood) and 970 ms ($\cong T_1$ of myocardium). Excitation, gradient de-phasing, and RF spoiling were simulated. A voxel was considered to be composed of 200 spins spread out over the range of zero to 2π in the transverse plane as a result of the gradient de-phasing. An RF phase increment of 50° was used for RF spoiling. The trajectory of each spin was followed with each RF excitation and de-phasing, and the longitudinal and transverse magnetizations in the voxel were calculated after each preparation cycle as a complex sum of the magnetizations of all spins in the voxel.

Figure 7:
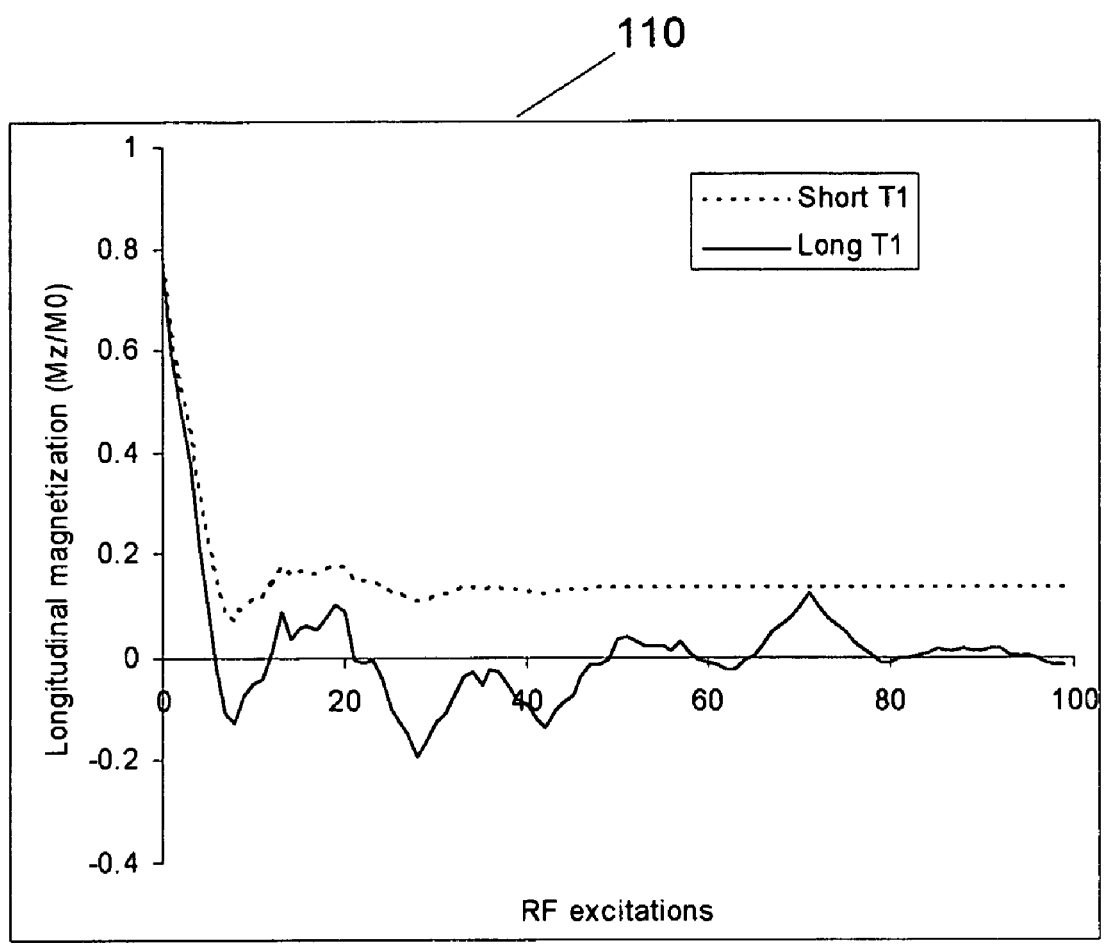
FIG. 7 shows a plot of simulated signal trajectories of $T_1$ species.

Referring to FIG. 7, a plot 110 of the simulated trajectories of the longitudinal magnetization normalized by the equilibrium magnetization of a short $T_1$ species (57 ms) and a long $T_1$ species (970 ms) as a function of the number of applied RF excitations (i.e., preparation cycles completed) is shown. For a given number of RF excitations, the corresponding point along the y-axis is the longitudinal magnetization was simulated for each of the short and long $T_1$ species following the delay period of the RF preparation process. For example, after 10 RF preparation cycles, the short $T_1$ species exhibited a positive magnetization after the delay time while the long $T_1$ species exhibited zero magnetization. When approximately 7 or more RF preparation cycles were simulated, the resulting magnetization of the short $T_1$ species exhibited an approximate FLASH-like signal behavior and approached steady-state without undergoing inversion. The simulated magnetization of the long $T_1$ species, on the other hand varied with the number of preparation cycles. As seen in plot 100, the magnetization of the long $T_1$ species was phase inverted after 10, 30, 50, and 60 total preparation cycles were performed. To reduce the total time required to complete RF preparation, the smallest of these values (i.e., 10) was selected as the number of preparation cycles to be used in a subsequent RF preparation process.

Phantom Experiments

To validate the numerically simulated signal trajectories shown in FIG. 7, RF preparation processes using different numbers of preparation cycles were applied to a phantom having tubes containing different $T_1$ materials. The contents of some of the tubes included water doped with different concentrations of gadolinium contrast agent (Magnevist, Berlex). Two of the tubes included vegetable oil and peanut oil and were used to observe the effect of RF preparation on fat.

In each RF preparation process, a single-shot gradient-echo sequence was applied with non-selective excitation pulses and with the phase-encoding gradients switched off. A number of preparation cycles were applied at 40° before data acquisition. The preparation cycles were immediately followed by data acquisition using a FLASH sequence. The flip angle for data acquisition was 5°. The number of preparation cycles was varied, and the magnitude of the signal at the first echo was measured. The time delay was set to suppress the signal from the sample with $T_1$=970 ms ($\cong T_1$ of myocardium). The RF preparation parameters used in the experiment are shown below in Table 1.

TABLE 1

| RF Preparation Parameter | Value |
| --- | --- |
| RF preparation flip angle | 40° |
| Time delay | 30 ms |
| Repetition time | 3 ms |

The preparation pulses were made non-selective to reduce $B_1$ inhomogeneity and maintain similar image contrast throughout the slab. All imaging experiments were carried out on a Siemens 1.5T Symphony scanner which had a maximum gradient strength of 30 mT/m and a maximum gradient slew rate of 150 mT/m/ms.

The applied magnetic field was assumed to be uniform across the phantom, thus the signal measured at the first echo represented the summation of all spin magnetizations in the phantom as well as the longitudinal state of the net magnetization before data acquisition.

Image data was acquired using a segmented RF prepared FLASH sequence. The RF preparation and time delay were applied before each block of data acquisition. During data acquisition, a non-section-selective data acquisition RF pulse was used to reduce errors due to an imperfect slice profile of the magnetic field. A small flip angle (5°) was used for data acquisition to minimize the effect of imperfect spoiling, and thus to reduce errors in estimating the longitudinal magnetization after the RF preparation. The measured echo magnitude was divided by sin (5°) to yield the amplitude of the longitudinal magnetization after an applied RF preparation. The data acquisition parameters are shown below in Table 2.

TABLE 2

| Data Acquisition Parameter | Value |
| --- | --- |
| Repetition time | 4.2 ms |
| Echo time | 1.75 ms |
| Acquisition flip angle | 20o |
| Field of view (FOV) | 197 × 300 mm2 |
| Matrix size | 252 × 384 |
| Number of partitions | 6 |
| Number of interpolated partitions | 12 |
| Number of lines per segment | 33 |
| Readout bandwidth | 490 Hz/pixel |

Figure 8:
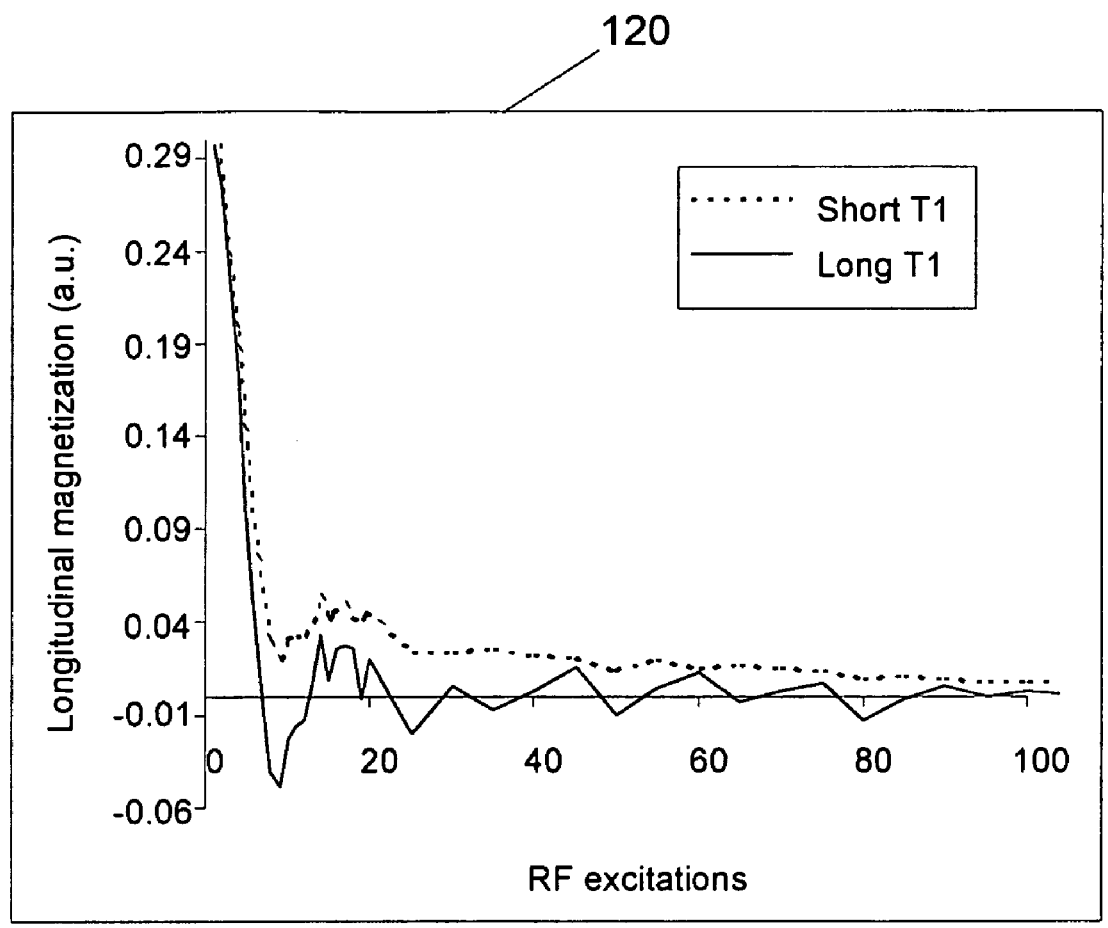
FIG. 8 shows a plot of measured signal trajectories of $T_1$ species.

Referring to FIG. 8, a plot 120 of the measured trajectories of the longitudinal magnetization in a short $T_1$ (95 ms) phantom and a long $T_1$ (900 ms) phantom as a function of the number of applied RF excitations is shown. The trajectories shown in the plot 120 are similar to the simulation results shown in the plot 110 of FIG. 7. When the number of excitations of the RF preparation exceeded about 7, the short $T_1$ phantom exhibited an approximate FLASH-like signal behavior and approached steady-state without undergoing inversion. The long $T_1$ phantom, on the other hand, exhibited a magnetization that varied with the number of excitations. As seen in plot 120, the magnetization of the long $T_1$ species was phase inverted (e.g., zero) when approximately 10 preparation cycles were performed. The results shown in plot 120 validate the numerical simulation results shown in FIG. 7.

Figure 9:
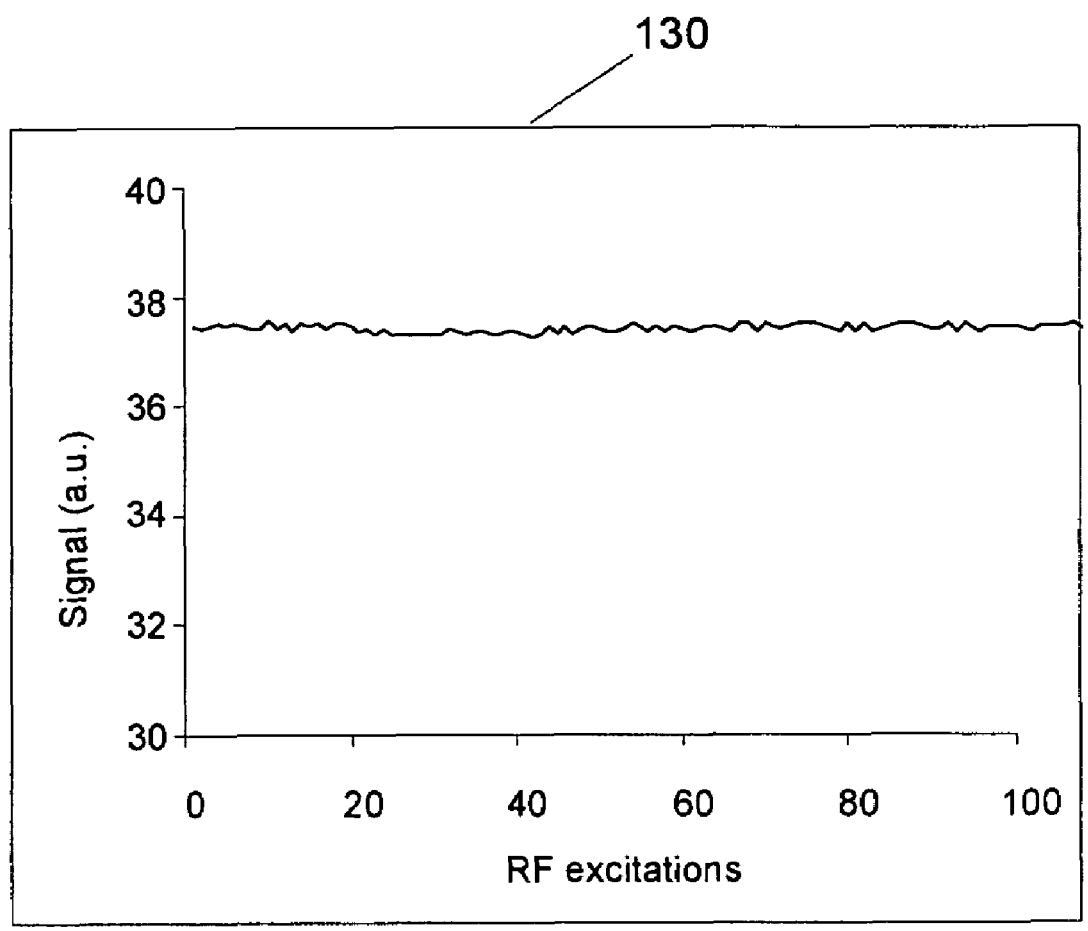
FIG. 9 shows a plot of a measured signal trajectory of a short $T_1$ species.

Referring to FIG. 9, a plot 130 the signal trajectory of the short $T_1$ phantom (95 ms) following a 30 ms time delay of an RF preparation is shown. The signal from the short $T_1$ phantom is relatively constant. The plot 130 indicates that the magnetization of the short $T_1$ phantom was in steady-state when data was first acquired and remained in steady-state throughout data acquisition.

Figure 10:
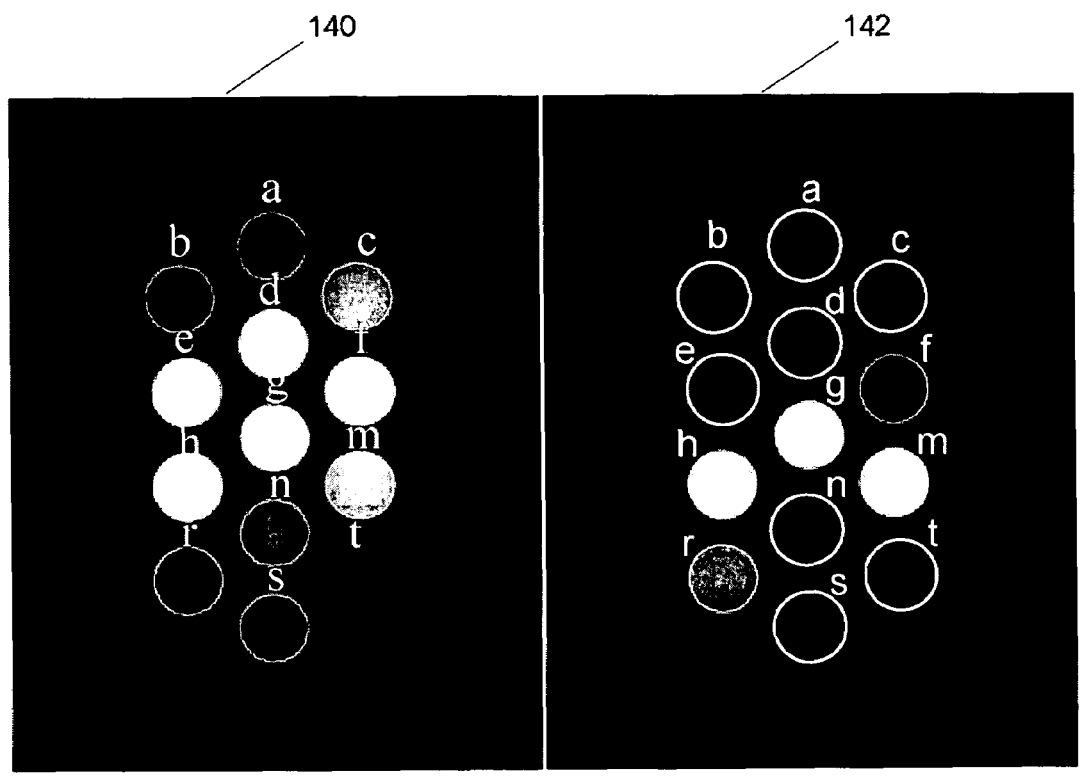
FIG. 10 shows images acquired from a phantom.

Referring to FIG. 10, another experiment was performed to assess whether steady-state signal amplitude could be achieved in the phantom by a preparation in which ten RF preparation cycles were applied to the phantom followed by a time delay of 30 ms. Data was acquired by applying 100 non-section-selective excitations at 5o flip angle. A resonance signal was measured at each echo and plotted as a function of the RF excitations. FIG. 10 shows an image 140 acquired from the phantom with a FLASH sequence without any RF preparation and an image 142 acquired with a FLASH sequence after an RF preparation was applied to the phantom. The filled circles shown in images 140 and 142 are the images of the individual tubes of the phantom, each of which contained a liquid with a unique $T_1$ value. Table 3 shows the $T_1$ values of the liquids contained in the phantom and their corresponding labels shown in images 140 and 142.

TABLE 3

| Label | $T_1$ Value (ms) |
| --- | --- |
| a | 270 |
| b | 970 |
| c | 483 |
| d | 58 |
| e | 280 |
| f | 76 |
| g | 57 |
| h | 57 |
| m | 46 |
| n (oil) | 256 |
| r | 56 |
| s (oil) | 256 |
| t | 2000 |

A comparison of phantom images b in images 140 and 142 shows that the signal from the tube that contained liquid with $T_1$=970 ms was completely suppressed when a time delay of 30 ms was used, while the signals from the tubes that contained liquids having $T_1$ that ranged between 57 ms and 100 ms (phantom images f, g, h, m, and r) were not suppressed. Furthermore, the signals from tubes whose contents had $T_1$ values that were greater than 100 ms were relatively to completely suppressed. The suppression of signals from these tubes is evident in phantom images a, b, c, d, e, n, s, and t, where phantom images n and s correspond to fat. In some embodiments, suppressing signals having $T_1$ values larger than 100 ms provides more uniform suppression in in-vivo imaging.

Volunteer Experiment

The segmented RF prepared gradient-echo sequence was used for contrast-enhanced coronary magnetic resonance angiography (MRA) in one healthy volunteer to demonstrate the $T_1$-selective inversion property of the RF preparation. The RF preparation parameters used in the volunteer experiment are shown below in Table 4.

TABLE 4

| RF Preparation Parameter | Value |
| --- | --- |
| RF preparation flip angle | 50° |
| Repetition time | 3 ms |

The data acquisition parameters are shown below in Table 5.

TABLE 5

| Data Acquisition Parameter | Value |
| --- | --- |
| Repetition time | 3.9 ms |
| Echo time | 1.5 ms |
| Acquisition flip angle | 200 |
| Field of view (FOV) | 206 × 300 mm2 |
| Matrix size | 140 × 256 |
| Number of partitions | 6 |
| Number of interpolated partitions | 12 |
| Number of lines per segment | 35 |

TABLE 5-continued

| Data Acquisition Parameter | Value |
| --- | --- |
| Readout bandwidth | 490 Hz/pixel |
| Total scan time | 24 heartbeats |

A fat suppression pulse was not used during data acquisition. For the post-contrast scan, the dose of contrast agent was injected uniformly using a Spectris MR injector (Medrad, Inc., Indianola, Pa.) through the anti-cubital vein of the right arm. An injection of 30 ml of Gd-DTPA was used at 1.5 ml/s, followed by an injection of 20 ml saline. To improve post-contrast imaging, a timing run was performed before the high-resolution scan to estimate the arrival time of the bolus in the coronary arteries.

Figure 11:
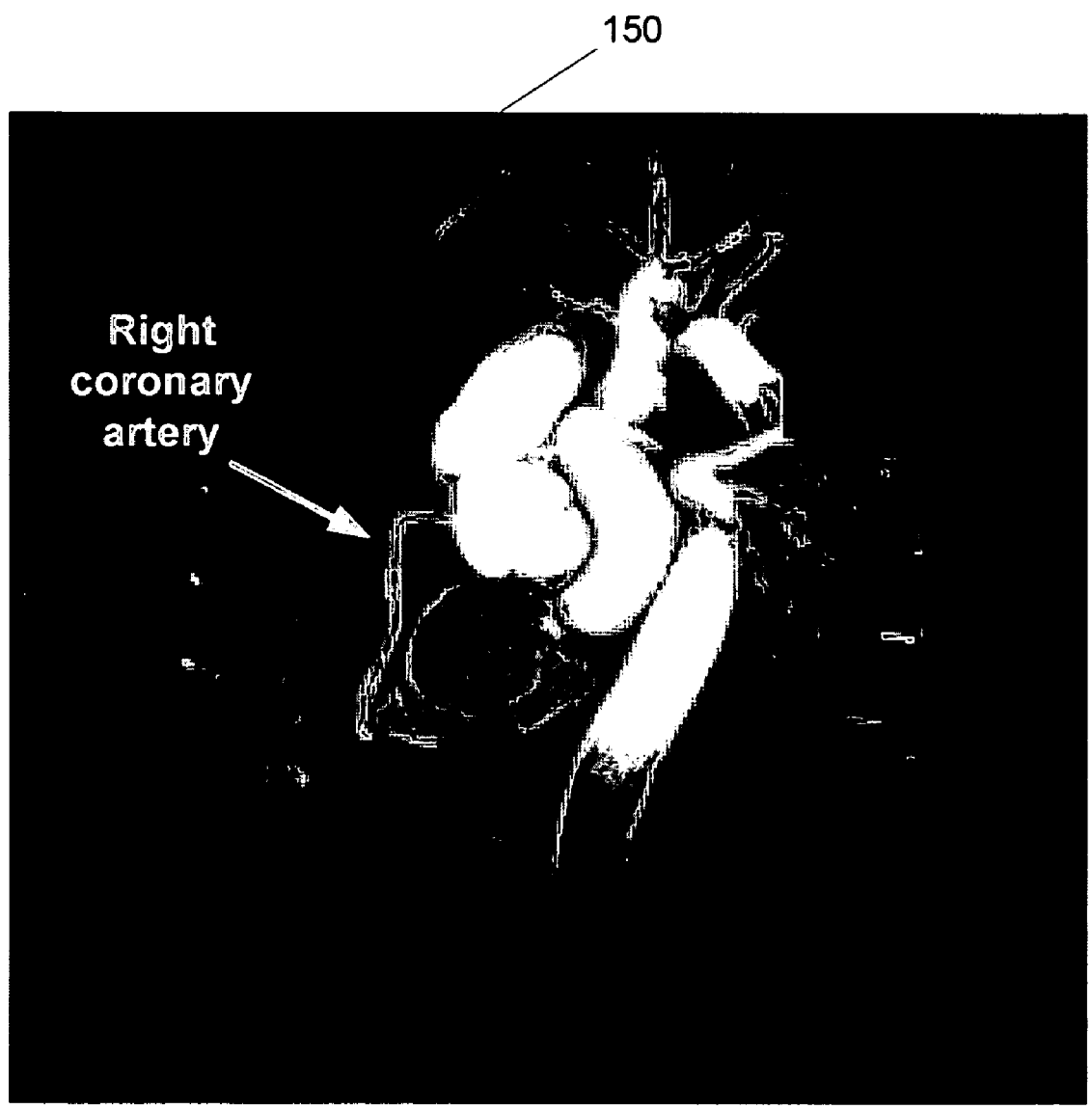
FIG. 11 shows an image acquired from a human volunteer.

Referring to FIG. 11, an image 150 acquired from the volunteer is shown. The image 150 shows the heart of the volunteer including the right coronary artery. A high blood background contrast was achieved, thereby improving the delineation of the coronary artery. As can be seen from the image 150, the RF-prepared FLASH sequence achieved background suppression while maintaining a high blood signal. Fat signals and myocardial signals were also suppressed by the RF preparation without the use of a fat suppression pulse. As evident by image 150, high definition and image contrast can be achieved by using RF preparation to suppress unwanted signals having a wide range of $T_1$ values.

RF preparation may be combined with a saturation-recovery (SR) prepared FLASH sequence that is generally used for perfusion imaging. In particular, RF preparation may be used to improve resolution and contrast of images acquired using SR prepared FLASH techniques and to reduce the time of the imaging procedure.

RF preparation may be applied to cardiac viability imaging to suppress signals from normal myocardium and simultaneously generate high signals from infracted myocardium. Conventional inversion recovery preparation has a limitation that the choice of each inversion time is unique for suppression of a specific $T_1$ species, and as such, can lead to sub-optimal suppression of a range of unwanted $T_1$ species. In comparison to conventional inversion recovery, RF preparation can suppress the background more evenly for a range of unwanted $T_1$ species while maintaining strong steady-state signals from the short $T_1$ species.

RF preparation may be applied to contrast-enhanced coronary MRA imaging techniques. Currently, these techniques employ IR-prepared FLASH sequences that acquire data while the blood signal changes from a transient state to steady-state. Because the IR-prepared FLASH sequences acquire data from transient signals, rather than steady-state signals, the images constructed from the data are often blurred. Using RF preparation rather than IR preparation in contrast-enhanced coronary MRA reduces or prevents image blurring by enabling data to be acquired from the blood signal when the blook signal is relatively close to steady-state.

In conventional contrast-enhanced coronary MRA, fat suppression is often achieved by applying a spectrally selective fat-suppressive pulse to the region of interest. The pulse is configured to selectively saturate fat protons prior to acquiring data as in standard sequences, so that they produce negligible signal. The application of such a pulse has the drawback of making the region of interest more susceptible to field inhomogeneities, which in turn degrade the quality of the image. RF preparation on the other hand achieves fat suppression based on the $T_1$ of fat and does not depend on its chemical shift. Therefore, a region of interest that has undergone RF preparation is more robust to field inhomogeneities than a region of interest that has been zapped with a conventional fat-suppressive pulse.

The processes described herein, including imaging process 60, parameter determination process 62, RF preparation process 64, data acquisition process 66, signal processing process 68, and control process 70 can be implemented in digital electronic circuitry, or in computer software, firmware, or hardware, including the structural means disclosed in this specification and structural equivalents thereof, or in combinations of them. The processes can be implemented as one or more computer program products, i.e., one or more computer programs tangibly embodied in an information carrier, e.g., in a machine readable storage device or in a propagated signal, for execution by, or to control the operation of, data processing apparatus, e.g., a programmable processor, a computer, or multiple computers. A computer program (also known as a program, software, software application, or code) can be written in any form of programming language, including compiled or interpreted languages, and it can be deployed in any form, including as a stand alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub programs, or portions of code). A computer program can be deployed to be executed on one computer or on multiple computers at one site or distributed across multiple sites and interconnected by a communication network.

The processes described herein, including method steps, can be performed by one or more programmable processors executing one or more computer programs to perform functions of the processes by operating on input data and generating output. The processes can also be performed by, and apparatus of the processes can be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. Information carriers suitable for embodying computer program instructions and data include all forms of non volatile memory, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

The processes can be implemented and distributed across different system components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

The foregoing are examples for illustration only and not to limit the alternatives in any way. The steps of the processes described herein can be performed in a different order and/or one or more such steps can be omitted and still achieve desirable results. The steps of the processes do not need to be performed in real-time though some or all of them could be performed in real-time. Furthermore, some of the steps of the processes could be performed asynchronously.

A number of embodiments of the invention have been described. Nevertheless, it will be understood that various modifications may be made without departing from the spirit and scope of the invention. For example, the preparation process may be combined with any data acquisition processes that detect a resonance signal from a region of interest. Examples of data acquisition processes include but are not limited to fast low-angle shot (FLASH), gradient-echo acquisition, spin-echo acquisition, steady-state free precession (SSFP), and echo planar acquisition. The preparation process may be implemented in a variety of magnetic resonance imaging schemes including nuclear magnetic resonance imaging (NMRI), magnetic resonance angiography (MRA), magnetic resonance spectroscopy, diffusion MRI, functional MRI, and interventional MRI. The preparation process may also be applied to any structure or portion of a body or subject that can be imaged using magnetic resonance imaging including the heart, brain, muscles, liver, and other biological organs and tissues.

Other embodiments not specifically described herein are also within the scope of the following claims.

What is claimed is:

1. A system for acquiring a medical image of a region of interest, the system comprising:
    a control sequence unit configured to direct an RF (radiofrequency) coil to:
    apply a plurality of electromagnetic excitation pulses to the region of interest according to predetermined parameters, the plurality of electromagnetic excitation pulses being sufficient to generate first and second species within the region of interest such that a longitudinal magnetization of the first species is inverted, the first species having a longer longitudinal relaxation time constant ($T_1$ constant) than the second species;
    apply electromagnetic energy sufficient to de-phase transverse magnetizations of first and second species, the transverse magnetizations being oriented in a transverse direction with respect to an applied magnetic field; and
    a controller in communication with the control sequence unit, the controller configured to determine an expiration of a predetermined delay period after which the longitudinal magnetization of the first species reaches zero and a longitudinal magnetization of the second species is in steady-state.

2. The system of claim 1, further comprising:
    a data acquisition unit in communication with the controller, the data acquisition unit configured to acquire resonance signals from the region of interest after the predetermined delay period has expired; and wherein the controller is further configured to reconstruct an image from the resonance signals, wherein the image shows a tissue that generated the second species and does not show a tissue that generated the first species.

3. The system of claim 2, wherein the tissue that generated the first species comprises fat.

4. The system of claim 2, wherein the plurality of electromagnetic excitation pulses are sufficient to suppress a third species within the region of interest, the third species having a $T_1$ constant that is different than the $T_1$ constant of the first species and longer than a $T_1$ constant of the second species; and wherein the image does not show a tissue that generated the third species.

5. The system of claim 1, wherein the sequence control unit is further configured to direct the RF coil to apply a predetermined number of alternating sequences of excitation pulses and electromagnetic energy sufficient to de-phase transverse magnetizations of first and second species.

6. The system of claim 1, wherein the predetermined parameters comprise one or more of the following:
 a predefined number of electromagnetic excitation pulses;
 a repetition time between an application of successive electromagnetic excitation pulses;
 a flip angle of each of the plurality of electromagnetic excitation pulses; and
 the predetermined delay period.

7. The system of claim 6, wherein the delay period is a value between 10 ms and 70 ms.

8. The system of claim 2, wherein the data acquisition unit is further configured to acquire the resonance signals using a data acquisition process selected from the group consisting of: fast low-angle shot (FLASH) acquisition, gradient-echo acquisition, spin-echo acquisition, steady-state free precession (SSFP) acquisition, and echo planar acquisition.

9. A method for acquiring a medical image of a region of interest, the method comprising:
 applying a plurality of electromagnetic excitation pulses to the region of interest according to predetermined parameters, the plurality of electromagnetic excitation pulses being sufficient to generate first and second species within the region of interest such that a longitudinal magnetization of the first species is inverted relative to zero, the first species having a longitudinal relaxation time constant ($T_1$ constant) that is longer than a $T_1$ constant of the second species;
 applying electromagnetic energy sufficient to de-phase transverse magnetizations of the first and second species, the transverse magnetizations being oriented in a transverse direction with respect to an applied magnetic field; and
 waiting for a predetermined delay period after which the longitudinal magnetization of the first species reaches zero and a longitudinal magnetization of the second species is in steady-state.

10. The method of claim 9, further comprising:
 measuring resonance signals from the region of interest after the predetermined delay period has expired; and
 reconstructing an image from the resonance signals, wherein the image shows a tissue that generated the second species but does not show a tissue that generated the first species.

11. The method of claim 9, wherein applying electromagnetic energy comprises implementing one or more of gradient de-phasing and RF spoiling.

12. The method of claim 9, wherein applying electromagnetic energy comprises de-phasing the first and second species following an individual application of each of the plurality of electromagnetic excitation pulses.

13. The method of claim 12, determining the predetermined parameters using one or more of a computer simulation and a phantom experiment, the phantom experiment comprising a model of a structure to be imaged.

14. The method of claim 9, wherein the predetermined parameters comprise:
 a predefined number of electromagnetic excitation pulses, a repetition time between an application of successive electromagnetic excitation pulses, a flip angle of each of the plurality of electromagnetic excitation pulses, and the predetermined delay period.

15. The method of claim 9, further comprising selecting a flip angle of each of the plurality of electromagnetic excitation pulses to be a value within a range between 30 and 60 degrees.

16. A computer program product for implementing an exception handling framework, the computer program product being tangibly stored on machine readable media, comprising instructions operable to cause one or more processors to:
 direct an RF coil to apply a plurality of electromagnetic excitation pulses to the region of interest according to predetermined parameters, the plurality of electromagnetic excitation pulses being sufficient to generate first and second species within the region of interest such that a longitudinal magnetization of the first species is inverted relative to zero, the first species having a longitudinal relaxation time constant ($T_1$ constant) that is longer than a $T_1$ constant of the second species;
 direct the RF coil to apply electromagnetic energy sufficient to de-phase transverse magnetizations of the first and second species, the transverse magnetizations being oriented in a transverse direction with respect to an applied magnetic field; and
 determine an expiration of a predetermined delay period after which the longitudinal magnetization of the first species reaches zero and a longitudinal magnetization of the second species is in steady-state.

17. The product of claim 16, further comprising instructions to:
 direct a data acquisition unit to measure resonance signals from the region of interest after the predetermined delay period has expired; and
 reconstruct an image from the resonance signals, wherein the image shows a tissue that generated the second species but does not show a tissue that generated the first species.

18. The product of claim 16, further comprising instructions to direct the data acquisition unit to implement one or more of gradient de-phasing and RF spoiling.

19. The product of claim 16, further comprising instructions to direct the RF coil to apply a predetermined number of alternating sequences of electromagnetic excitation pulses and electromagnetic energy sufficient to de-phase transverse magnetizations of the first and second species.

20. The product of claim 16, further comprising instructions to retrieve the predefined parameters from memory, wherein the predetermined parameters comprise:

a predefined number of electromagnetic excitation pulses;

a repetition time between an application of successive electromagnetic excitation pulses;

a flip angle of each of the plurality of electromagnetic excitation pulses; and the predetermined delay period.

* * * * *